United States Patent [19]

Goldstein

[11] Patent Number: 4,776,895
[45] Date of Patent: Oct. 11, 1988

[54] MULTIBAND EMITTER MATCHED TO MULTILAYER PHOTOVOLTAIC COLLECTOR

[75] Inventor: Mark K. Goldstein, La Jolla, Calif.

[73] Assignee: Quantum Group, Inc., San Diego, Calif.

[21] Appl. No.: 57,902

[22] Filed: Jun. 2, 1987

[51] Int. Cl.[4] .............................................. H02N 6/00
[52] U.S. Cl. .................................. 136/253; 136/249; 431/100
[58] Field of Search ........................... 136/253, 249 TJ

[56] References Cited

PUBLICATIONS

E. S. Vera et al., *Conference Record, 15th IEEE Photovoltaic Specialists Conf.*(1981), pp. 877–882.
E. S. Vera et al., *Proceedings, 4th E.C. Photovoltaic Solar Energy Conf.*(Stresa), Reidel Pub. Co. (1982), pp. 659–665.

*Primary Examiner*—Aaron Weisstuch
*Attorney, Agent, or Firm*—Christie, Parker & Hale

[57] ABSTRACT

A thermophotovoltaic electric generating system provides high thermal to electric conversion efficiency by use of matched radiation emitter and radiation collector. The radiation emitter comprises ceramic materials which emit thermally stimulated quantum radiation in at least two characteristic wavelength bands when heated above a threshold temperature. By employing a low emissivity ceramic doped with rare earth metal oxide, more than 50% of the radiation emitted from the surface can be concentrated in two or more characteristic wavelength bands. A multilayer photovoltaic device selectively absorbs the radiation at the characteristic wavelength bands for high electric conversion efficiency. An overlying layer of the photovoltaic collector selectively absorbs at least one of such characteristic wavelength bands and is transparent to another wavelength band which is absorbed by an underlying photovoltaic layer. Preferably the emitter is a porous fiber matrix surface combustion burner comprising primarily aluminum oxide, from 8 to 20% yttrium oxide, and a minor amount of rare earth metal oxide. A ceramic tube burner may be used in an embodiment with preheated air, the outside of the tube having such a thermally stimulated quantum emitter.

21 Claims, 4 Drawing Sheets

MULTIBAND EMITTER MATCHED TO MULTILAYER PHOTOVOLTAIC COLLECTOR

BACKGROUND OF THE INVENTION

This invention relates to a thermophotovoltaic (TPV) apparatus for generating electricity using an emitter with multiple spectral bands matched to the absorption bands of a multilayer photovoltaic device.

Electric power can be generated by heating a radiation emitter to a sufficient temperature that it will emit infrared or visible radiation. Such radiation is absorbed by a photovoltaic device such as a silicon cell to produce an output voltage and current. The emitter may be a blackbody or "grey body" with typical broad band thermal emission. Alternatively, it may be a thermally stimulated quantum emitter which produces radiation in a relatively narrow spectral band when heated above a threshold temperature. A variety of photovoltaic devices are commerically available for absorbing such radiation.

U.S. Pat. No. 3,188,836 by Kniebes describes utilization of emissive radiation from a glowing mantle in a gas lamp to generate sufficient power to control a valve. U.S. Pat. No. 3,331,701 by Werth provides a description of a thermophotovoltaic power producing device. R. M. Swanson in "Silicon Photovoltaic Cell in TPV Conversion," ER 12712, Project 790-2, Stanford Univ., (December 1979), who pioneered the fundamentals of blackbody thermal voltaic devices, describes an efficient solar cell. This cell work was initiated to optimize the performance of silicon cells when used in conjunction with a blackbody emitter. Swanson has also reported that these cells produce electric power with an efficiency of 26% using a tungsten filament heated to about 2200° K. as the heat source. *Proceedings of IEEE*, 67 (1979) 446; ER-1277, Project 790-2, Stanford Univ., (December 1979).

The efficiency of a narrow band emitter operating at the same power level should be much greater than where power is generated from radiation from a blackbody emitter. U.S. patent application Ser. No. 659,074 filed Oct. 5, 1984, and Ser. No. 701,369, filed Feb. 13, 1985 both assigned to the same assignee of this application, and European Patent Publication No. 84 306033.6 by Nelson, and European Patent Publication No. 83 108018.9 by Diederich disclose advantages of using rare earth metal oxide narrow band emitters matched to the absorption characteristics of photovoltaic devices to produce efficient energy conversion for use in various gas appliance control and power production applications. Application Ser. No. 659,074 was a National Application corresponding to International Application PCT/US84/01038 filed July 3, 1984, which was a continuation-in-part claiming priority of U.S. patent application Ser. No. 517,699, filed July 25, 1983. The aforementioned patent applications are now abandoned.

British Pat. No. 124 by Carl Auer von Welsbach was the origin of the first successful gas light mantle almost 100 years ago. That structure comprises a thermally stimulated quantum emitter comprising ceria. Such a mantle is designed to emit a broad band spectrum of white light rather than a narrow band. In "High Temperature Spectral Emitters of Oxides of Erbium, Samarium, Neodymium, & Ytterbium", *Applied Spectroscopy*, 26 (1972) 60–65, Guido Guazzoni suggested the use of narrow band emitters for electric power production. His data suggested that the spectral emittance of ytterbia ($Yb_2O_3$) is particularly well suited for use with silicon photovoltaic devices in a power production system.

The next major steps in the development of thermal voltaic power technology involved improvements in materials science. In European Patent Publication 84 306033.6, R. E. Nelson describes a small strong mantle capable of withstanding 1000 g. This is almost 100 times stronger than the Welsbach type mantle. In U.S. patent application Ser. No. 864,088, filed May 16, 1986, Goldstein shows another approach for strong emissive devices for implementing large scale cogeneration appliances.

For the past several years there has been appreciable research on blackbody thermophotovoltaic devices reported in R. N. Braewell and R. M. Swanson, "Silicon Photovoltaic Cells in TPV Conversion," EPRI ER-633, (February 1978); J. C. Bass, N. B. Elsner, R. J. Meyer, P. H. Miller, Jr., and M. T. Sinmad, "Nuclear-Thermophotovoltaic Energy Conversion," NASA CR-167988 (GA-A16653) G. A. Technologies, Inc., (December 1983); L. D. Woolf, J. C. Bass, and N. B. Elsner, "Variable Band Gap Materials for Thermophotovoltaic Generators," GA-A18140, GA Technologies, Inc., (December 1983); and papers mentioned above. In these documents, Swanson indicates that efficiencies of at least 50% may be possible and he has measured conversion efficiencies of about 30% with a relatively crude experimental setup using a blackbody emitter. Fahrenbruch states that the photovoltaic conversion efficiency when using an emitter which emits narrow band radiation, may be much greater than that obtained using blackbody radiation.

The reason for this improvement in conversion efficiency is that the energy required to promote an electron from the conduction band to the valence band is equivalent to a specific quantity of energy or wavelength, the band gap energy. For each photon absorbed by the photovoltaic device, one electron is promoted into the conduction band. If the photons absorbed have energy in excess of the band gap energy, the excess energy is converted into heat or phonons and this decreases the conversion efficiency. It is, therefore, desirable to absorb radiation with minimal deviation from the band gap energy.

Ytterbia is a narrow band emitter which emits photons over a narrow range of energies with a band width of 50 to 100 nanometers centered at about 950 to 1000 mm. Use of this emitter material produces a substantial improvement in the thermophotovoltaic energy conversion efficiency when compared to the use of blackbody emitters and may lead to the development of many practical devices for generation of electric power. As shown by Nelson in U.S. Pat. No. 4,584,426, the emissive output over the range of from 400 to 2500 nanometers should have 50% of the radiant energy within a single band.

It is clearly of significance in power generating system to enhance the thermal to light conversion efficiency. Thus, it is desirable to enhance the proportion of the thermal energy that goes into heating the emitter which is finally absorbed by the photovoltaic devices and efficiently converted to electric power.

SUMMARY OF THE INVENTION

There is, therefore, provided in practice of this invention, according to a presently preferred embodiment, a thermophotovoltaic electric power generating system comprising a ceramic emitter and a photovoltaic collector. The emitter comprises at least one thermally stimulated quantum emitter material for emitting radiation in at least two wavelength bands when heated above a threshold temperature. The photovoltaic collector comprises a multilayer cell matched to the emitter for selectively absorbing radiation in the same bands emitted by the emitter. One preferred embodiment of emitter for a selfpowered gas appliance comprises a porous fiber matrix burner formed of a multiplicity of ceramic fibers sintered together to form a rigid, gas permeable body. At least the portion of fibers adjacent to the outside surface of the body have at least one thermally stimulated quantum emitter material for emitting radiation in at least two bands when heated.

Another preferred embodiment of the invention comprises a ceramic tube including multiband thermally stimulated quantum emitters and is for high electric power output appliances such as a cogenerator or multiintegrated appliance which must use a solid ceramic burner. This solid burner keeps the hot combustion gas confined and away from the photovoltaic materials, thus allowing the photovoltaic cells to be closer to the light source. This solid burner system allows the air to be preheated by means of a recuperator without flashback.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION

Figure 4:
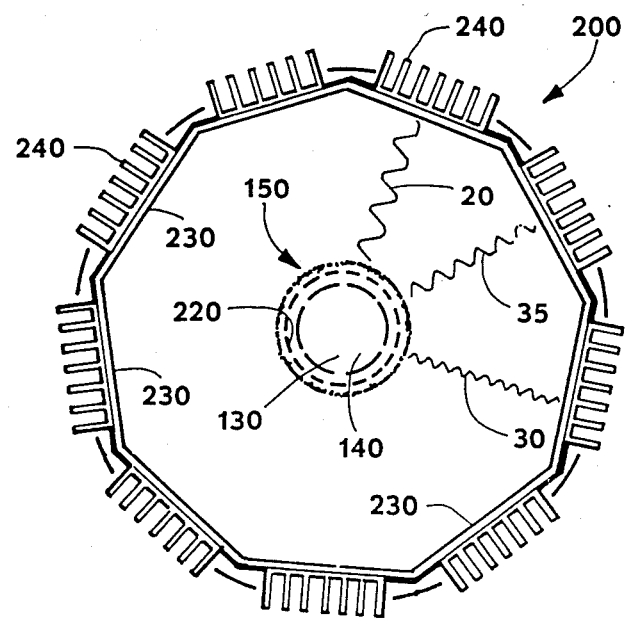
FIG. 4 illustrates in top or end view a thermophotovoltaic power generating system.

FIG. 4 illustrates schematically an exemplary photovoltaic power generating system as may be employed in practice of this invention. In this embodiment a roughly cylindrical emitter 150 is centrally located in the apparatus. Surrounding the emitter are a plurality of photovoltaic devices 230 which may be fitted with cooling fins 240 to prevent overheating. For this later purpose, a transparent heat shield (not shown) may also be interposed between the emitter and the photovoltaic collectors 230.

As described in greater detail hereinafter, the emitter comprises thermally stimulated quantum emitting materials which emit characteristic radiation in two, three or more wavelength bands. This concept is indicated schematically in FIG. 4 by representing radiation with short wavelength 30, intermediate wavelength 35 and long wavelengh 20. It should be recognized that such radiation is emitted in all directions rather than the specific directions indicated schematically in the drawing. Similar indications of such radiation are included in FIGS. 1 to 3.

Figure 1:
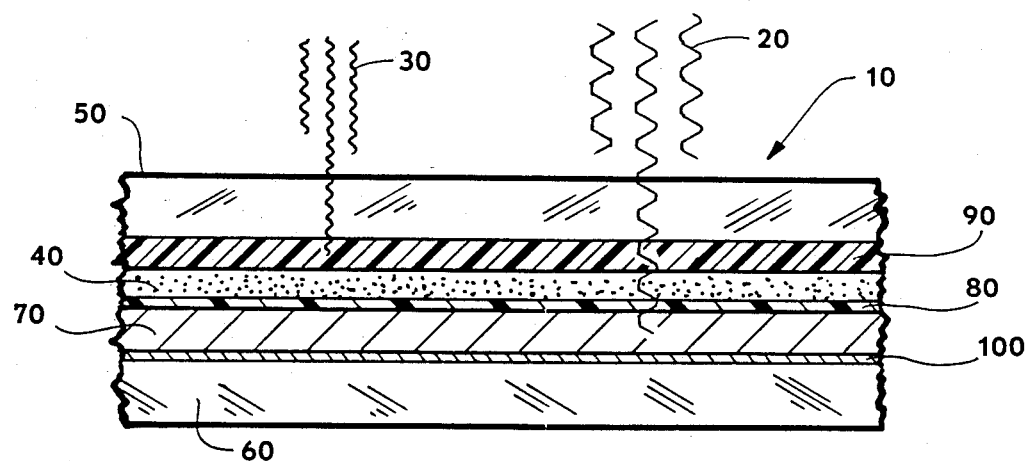
FIG. 1 illustrates in fragmentary schematic cross section a multilayer photovoltaic collector employed in practice of this invention.

Radiation from the emitter is absorbed and converted to electric power by a multilayer collector to provide high conversion efficiency. Such a collector may be fabricated on a glass substrate 60 and be protected by a glass cover plate 50. The active portion of the collector is quite thin, for exmaple 10 microns and the illustration in FIG. 1 is only schematic without attempting to indicate the relative thicknesses of the several layers forming the collector. A thin metal mirror 100, such as a layer of molybdenum 0.3 microns thick, is deposited on the glass substrate so that radiation that may pass through the active layers without absorption is reflected back through such layers to enhance total absorption.

The underlying active layer 70 in this embodiment comprises copper indium diselenide. This material has a high degree of absorption of light throughout the visible and infrared spectrum to enhance overall efficiency of the collector. The overlying active layer 40 preferably comprises amorphous silicon. This material is actually a silicon-hydrogen "alloy" having the approximate formula $SiH_{0.16}$. This material is preferred because of its high absorption in a spectral band centered at about 5200 nanometers. By doping and varying the hydrogen content, the absorption band can be shifted as desired to match the emission characteristics of the emitter. Antireflective coatings 80 and 90 are applied over the active layers for minimizing reflection at interfaces with differences in index of refraction. The concept of absorption of radiation of different wavelengths in each active layer of the collector is indicated by absorption of a relatively shorter wavelength radiation 30 in the overlying layer which is also transparent to longer wavelength radiation 20 which is selectively absorbed in the underlying layer 70.

Typically, the various coatings on the glass substrate forming the multilayer collector are vacuum or vapor deposited successively on the glass substrate. Additional bonding materials (not illustrated) may also be employed. Further, the conventional electrical leads for conducting the generated power from the active layers are not illustrated in FIG. 1.

The materials employed in techniques for deposition are conventional and the absorption characteristics have been published in the literature. Multilayer absorbers are known for solar cells where the different absorption characteristics of the several layers are utilized for enhanced efficiency. The materials mentioned above are merely exemplary of other materials that may be used to absorb radiation in characteristic wavelength bands. It will also be apparent that additional layers may be employed for optimum absorption in characteristic bands matched to radiation emitted by a multiband emitter. For example, it is desirable to employ two layers with selective absorption bands and a third, bottom layer for absorbing any radiation not converted in the overlying layers.

Figure 2:
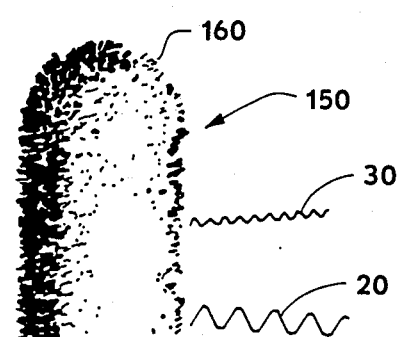
FIG. 2 is a side view of an exemplary porous fiber matrix burner employed in practice of this invention.

A preferred ceramic emitter 150 is illustrated in FIG. 2. In this embodiment the emitter is a porous surface combustion burner. Such a burner is formed on a metal or ceramic tube 130 and comprises a porous matrix 160 of ceramic fibers. A combustible mixture such as air and natural gas or vaporized LPG is introduced into the open end 140 of the tube. Gas passes through openings (suggested at 220 in FIG. 4) and passes through the porous matrix of ceramic fibers. Combustion occurs in the porous matrix adjacent to its outer surface. The fibers, such as illustrated in FIG. 3, at least those adjacent to the outer surface of the burner, are thereby heated to a sufficiently elevated temperature to emit radiation.

Figure 3:
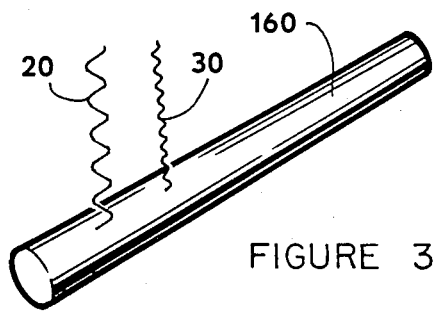
FIG. 3 is a perspective schematic of an individual fiber in the burner of FIG. 2.

The emitter, as suggested by the short and long wavelength radiation 20 and 30 in FIGS. 2 and 3, emits radiation in two or more characteristic wavelength bands. The wavelength bands emitted are a function of the thermally stimulated quantum emitting materials employed for fabricating the ceramic fibers.

A number of different ceramic materials may be used to provide multiband thermally stimulated quantum emission suitable for use in practice of this invention. Preferably the ceramic material comprises mixed oxides of metals to obtain sufficient mechanical strength in the porous surface combustion burner and emission of radiation in the desired wavelength bands. It is preferred that the base ceramic material be relatively inexpensive and have a low spectral emissivity. Suitable base materials include aluminum oxide, gallium oxide, yttrium oxide, and zirconium oxide. "Low spectral emissivity" as used herein means emissivity in about the same range as the spectral emissivity of such materials.

Multiband thermally stimulated quantum emittance is obtained by adding other metal oxides to the base ceramic. Metal fluorides may also be suitable. The other metals added preferably include lanthanide series rare earth metals. Examples particularly useful include protactinium, terbium, erbium, and cerium. Actinide metals may also be used, for example thorium oxide may substitute for yttrium oxide to yield a blue peak and a red peak nearer the infrared than the peak wavelengths from yttrium oxide.

The generalized formula for a mixed metal oxide emitter is $M_xZ_{1-x}O_{1-x}O_{(1.5+0.5x)}$ where M is a metal selected from the group consisting of aluminum, gallium, yttrium, zirconium, and thorium and Z can be an actinide, lanthanide, or other metal with inner shell electron vacancies. It is such metals that have a vacant inner electron hole to promote emission of thermally stimulated quantum radiation. The proportion of thermally stimulated quantum emitter material in the composition may be relatively small. For example, with an alumina or alumina yttria ceramic base, as little as 0.02% by weight protactinium in the composition can be sufficient. The proportion of terbium may be less than 1%. About 1% erbium or 2% cerium is sufficient.

Erbium additions to yttria produce striking emissions in the green as well as two other bands. For example, $Er_{0.05}Y_{0.95}O_{1.5}$ shows three characteristic emission bands. A composition comprising $Er_{0.05}Yb_{0.95}O_{1.5}$ shows similar characteristics with good power levels.

An exemplary composition comprises aluminum oxide with from 8 to 20% yttrium oxide doped with about 1% erbium. Addition of up to about 1.2% each of magnesium and tin appears to enhance the band shape and fiber strength. This composition is relatively inexpensive, has good strength and temperature resistance and emits radiation in wavelength bands quite suitable for matching to multilayer photovoltaic collectors.

As another example, the emitter may comprise $ZAlO_3$, $ZGaO_3$, or $Z_2O_3$, where Z is a mixture of various lanthanides and yttrium. Erbium is generally preferable since an $Er_2O_3$ emitter can be made to emit both emerald green and red bands as well as near infrared.

Another useful emitter comprises $Cr_xAl_{1-x}O_{1.5}$, analogous to a ruby laser. Such a material may be doped with rare earth metal oxides.

Another example showing three strong bands in the blue, green, and red portions of the spectrum comprises $Er_{0.2}Hf_{0.8}O_{1.9}$. These three bands may be spectrally matched with a three layer thin film photovoltaic device. The bands are similar to and somewhat weaker than those pure holmium oxide. Various mixtures of alumina, yttria and neodymia or $Nd_{0.5}Th_{0.5}O_{1.75}$ produce similar wavelength bands and may also be used.

Thoria doped with neodymium produces two very strong bands, one in the blue and one in the green. Four useful bands at 530, 600, 610, and 800 nm are produced. A ceramic comprising $Er_{0.33}Th_{0.67}O_{1.835}$ produces 4 bands at 520, 670, 1000, and 1600 nm.

A mixture of aluminum oxide and gallium oxide produces a blue band; however, doping with iron, chromium, cobalt, or rare earth metal oxides produces a variety of useful peaks. An emitter comprising $CoAl_2O_4$ doped with magnesium produces two usable bands, one in the red-orange and another in the blue region. An emitter comprising $Mg_{0.9}CoAl_2O_4$ emits a bright indigo blue band. Addition of 0.1 parts of zinc produces a second peak in the green. High conversion efficiency is obtained with a system having multiband emission and matched multiband absorption at the photovoltaic collector. Any body that is heated above the temperature of its surroundings loses energy by one or more of three mechanisms: conduction, convection, or radiation. The mechanism of radiative heat transfer is particularly important in thermophotovoltaic power generating systems because it involves the transfer of energy by photons. Most hot materials emit photons with energies ranging over a broad band which essentially covers the entire energy spectrum. The energy or wavelength at which the photons are emitted is determined by the temperature of the body. The proportion of energy lost by so called "blackbody" radiation also depends on the emissivity of the outer surface of the body. A high emissivity material emits radiation at a greater rate than a low emissivity material.

With a thermally stimulated quantum emitter such as the erbium doped aluminum oxide or other materials mentioned above, most of the photo emission occurs at specific energies which are not necessarily related to the actual temperature of the body once some minimum threshold temperature has been exceeded. A selective emission material requires less input energy to attain a given temperature because it is a poor blackbody emitter and therefore loses most of its energy by emitting photons only in narrow bands resulting from changes in the quantum states of inner shell electron vacanies. The quantum states are well defined in rare earth metal oxides, for example, and narrow characteristic wavelength bands are produced. The mixing of metal oxides affects the quantum states and the wavelength bands may be shifted and new bands appear, as suggested by the examples hereinabove.

For best emission efficiency, it is desirable that the ceramic have relatively low emissivity as provided by the alumina etc. mentioned above. This reduces the energy loses from "blackbody" radiation, thereby permitting a greater proportion of the input energy to be concentrated in the thermally stimulated quantum emission bands. By employing a multiband emitter, a still greater proportion of the input energy is radiated by quantum emission.

In practice of this invention the multiband emission spectrum is matched to a multiple band gap, thin film photovoltaic cell whose conversion characteristics match those of the emitter. Thus, each layer in the cell has a band gap that causes high absorption of radiation of a characteristic wavelength similar to the radiated wavelength of the quantum emitter. Each layer converts the emitted photons from a selected band to electricity at a high efficiency, and passes radiation that is not converted to underlying layers which more effectively convert the remaining wavelength bands.

Such a combination of selective multiband quantum emitters and matching multilayer photovoltaic cells is capable of producing electric power at high efficiency. Theoretical thermoradiation to electricity conversion efficiencies are greater than 50% It is believed that over 60% of the total energy emitted at 1400° to 1500° C. is in the energy range that can participate in photovoltaic conversion using multilayer photovoltaic cells. This can be compared with blackbody radiation at 1400° to 1500° C. where only about 4.5% of the total energy emitted can participate in the conversion mechanism which produces electricity in a silicon photovoltaic cell.

Figure 5:
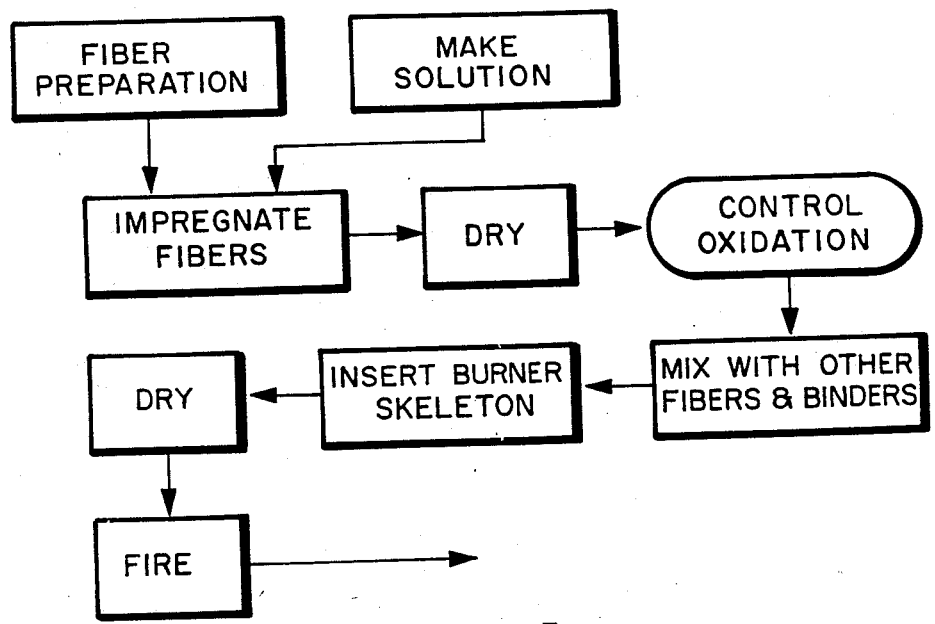
FIG. 5 is a block diagram indicating steps used for manufacturing a porous fiber matrix burner.
Figure 6:
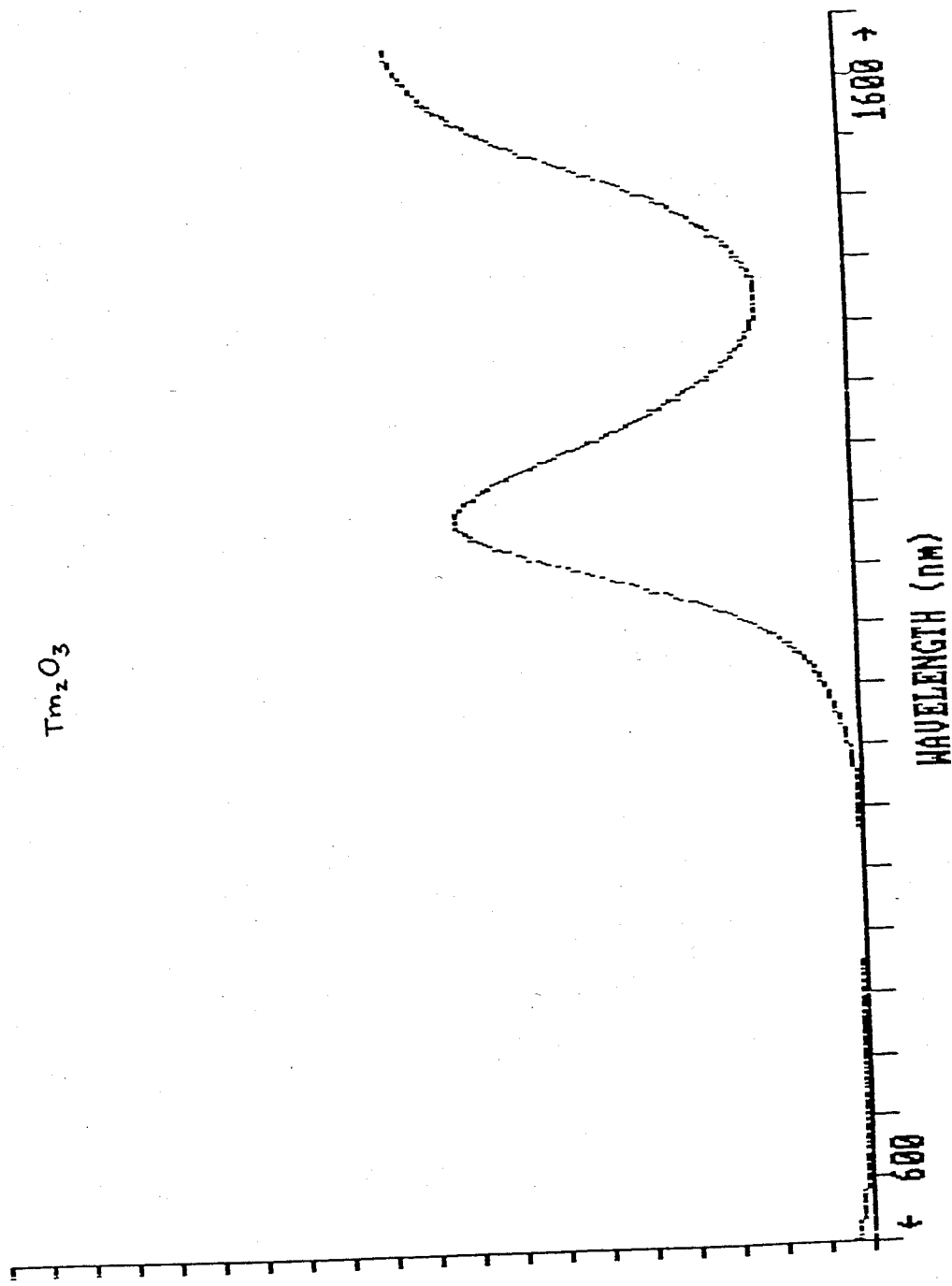
FIG. 6 is an exemplary emission curve for a thermally stimulated quantum emitter, namely thulium oxide, emitting radiation in two bands.

A porous surface combustion burner containing thermally stimulated quantum emitting ceramic materials is fabricated by a technique including steps as outlined in FIG. 5. Rayon fibers are chopped into short lengths in the range of from ½ to 2 centimeters. These rayon fibers are impregnated with solutions containing the metals desired in the completed ceramic fiber. Such a solution may be formulated with aluminum nitride, yttrium nitride, and erbium nitride, for example. Any of the rare earth metal or other metal nitrides may be used in appropriate proportions to result in compositions as described above.

When the fibers are saturated, they are treated with ammonia gas to reduce the nitrides, thereby reducing reaction rates in subsequent processing. The fibers are then dried and heated in the absence of oxygen to carbonize the rayon to a dark brown color. The carbonized fibers are mixed with chopped organic fibers such as rayon and an inorganic binder having a lower melting point than the ceramic fibers, such as an aluminosilicate clay.

A tubular "screen" is dipped in a slurry of such mixed fibers and binder with suction applied inside the screen. This forms a mat of fibers on the outside of the screen, which is withdrawn when a suitable thickness is obtained. The mat is dried and then fired in the presence of oxygen to a sufficient temperature to burn out the organic fibers and carbonized rayon fibers and bond the resultant ceramic fibers together. The permeability of the surface combustion burner can be adjusted by proportioning the organic and ceramic fibers in the slurry to leave adequate holes for passage of gas.

The "screen" on which the mat of fibers is formed can take a variety of forms. It may be a metal screen having sufficient oxidation resistance to accommodate the high temperature firing. During service, the screen which is adjacent to the inside surface of the porous burner is kept relatively cool by flow or gas, with combustion occurring largely near the exterior surface of the porous burner. Alternatively, the "screen" may be a perforated tube with a closed end. The tube may be made of metal or preferably may be of a strong ceramic such as mullite. A fine pattern of small holes through the tube is not required because diffusion in the mat of fibers on the outside of the tube assures adequately uniform flow distribution at the outside surface.

If desired, other techniques may be employed for forming a porous surface combustion burner having multiband quantum emitting ceramic at least adjacent to the outside surface of the burner. For example, instead of sintering fibers, granular ceramic materials may be mixed with granular organic materials and binder, and sintered to form a porous surface combustion burner.

Figure 7:
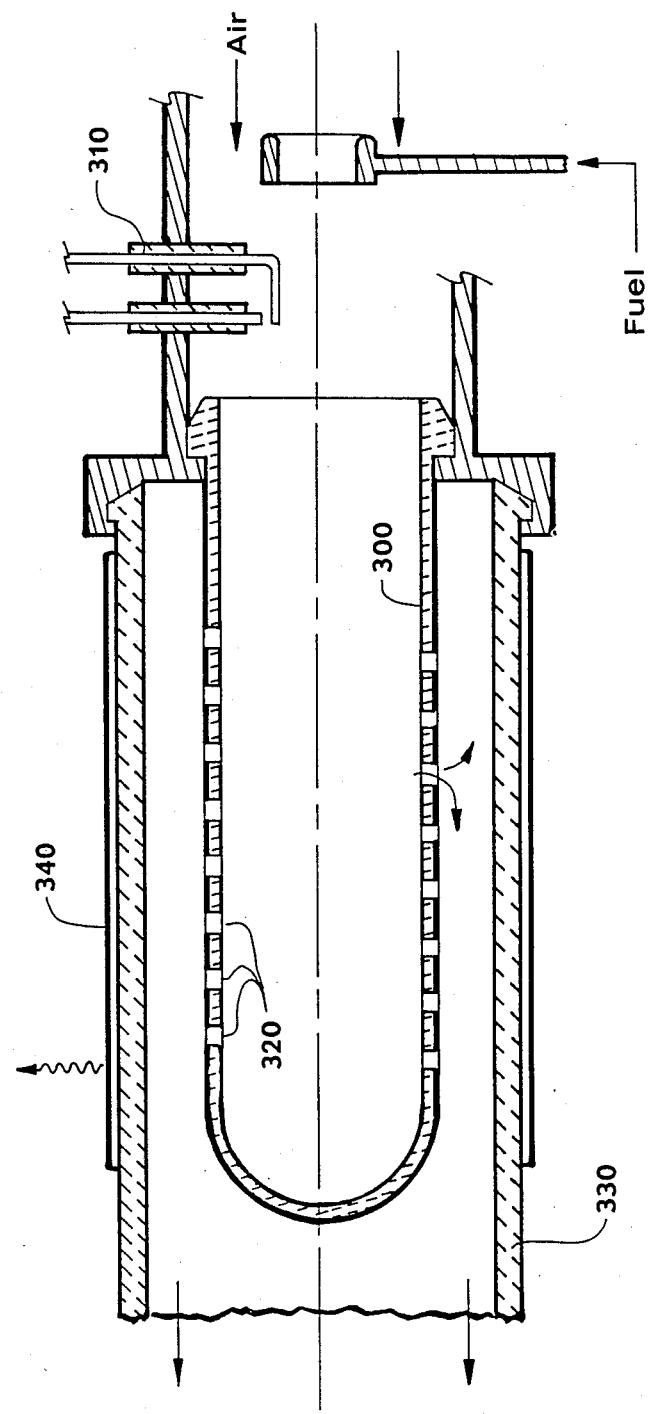
FIG. 7 is a schematic cross sectional view of solid quantum emitter burner for cogeneration appliances and other applications requiring preheating of the intake air.

A solid ceramic emitter is shown in a schematic longitudinal cross section in FIG. 7. In this embodiment, fuel and preheated air are mixed before entering a tubular ceramic combustor 300 and are ignited by a shank ignitor 310. Combustion takes place in the central combustor tube 300 and the combustion products are ejected through a number of small holes 320 in the central tube wall so that the hot combustion gases impinge on the inner surface of an outer ceramic tube 330. The impingement results in a high rate of energy transfer between the combustion gases and the outer tube. Another option in this design is to bring the fuel in separately, i.e., by means of a concentric tube with matched holes. This highly turbulent form of convective energy transfer is augmented by radiation energy transfer between the outer surface of the central tube and the inner surface of the outer tube. After interacting with the outer tube, the combustion gases are exhausted out one end of the outer tube and may be converted to useful work elsewhere in the system. Some of the energy of the hot exhaust gas is transferred in a recuperator for preheating the incoming air.

The outer surface 340 of the outer tube is made of or coated with a thermally stimulated quantum emitter oxide or mixed oxides as described above, which provide more than one narrow band emission of selected wavelength. Exemplary ceramic material for both the combustor tube and the outer tube comprises yttria stabilized alumina which may have a thin layer 340 of a rare earth metal oxide or mixed oxides on the outside. The narrow band emissions are absorbed by a plurality of multilayer photovoltaic cells (not shown) which surround the emitting surface with some intervening space, just as in the embodiment employing a fiber matrix burner.

Although a broad variety of ceramics with multiple band quantum emissions have been described above, it will be apparent that many other such quantum emitters are suitable for use in practice of this invention. Likewise, a variety of materials may be used in the multiple layers of the photovoltaic devices for selectively absorbing in wavelength bands matched to the wavelength bands of the emitter. These may be materials different from those hereinabove mentioned, or may be similar with doping to change the band gap and hence, the wavelengths absorbed.

Many other modifications and variations will be apparent to one skilled in the art, and it is therefore, to be understood that within the scope of the appended claims the invention may be practiced otherwise than as specifically described.

What is claimed is:

1. A thermophotovoltaic electric power generating system comprising:

a ceramic emitter comprising a metal oxide having a low emissivity in about the same range as the emissivity of aluminum oxide, gallium oxide, thorium oxide, yttrium oxide, zirconium oxide, and at least one thermally stimulated quantum emitter material for emitting radiation in at least two wavelength bands when heated above a threshold temperature; and a multilayer photovoltaic collector matched to the emitter for selectively absorbing radiation in the same wavelength bands emitted by the emitter.

2. A system as recited in claim 1, wherein the emitter comprises oxides of metals having unfilled inner electron shells.

3. A system as recited in claim 2, wherein the emitter comprises at least one rare earth metal oxide.

4. A system as recited in claim 3 wherein, the emitter comprises a minor amount of erbium oxide.

5. A system as recited in claim 1, wherein the emitter is primarily an oxide of at one metal selected from the group consisting of aluminum, gallium, yttrium, zirconium, and thorium.

6. A system as recited in claim 1, wherein the emitter comprises primarily aluminum oxide, from 8 to 20% yttrium oxide, and a minor amount of rare earth metal oxide.

7. A system as recited in claim 6, wherein the emitter further comprises a minor amount of an oxide of a metal selected from the group consisting of magnesium and tin.

8. A system as recited in claim 1, wherein each active layer of the photovoltaic collector selectively absorbs at least one characteristic wavelength band of radiation and is transparent to radiation in other wavelength bands.

9. A thermophotovoltaic electric power generating system comprising:
   an emitting surface comprising a low emissivity ceramic and including at least one thermally stimulated quantum emitting material;
   means for heating the surface to a sufficient temperature for stimulating such material to emit radiation in at least two characteristic wavelength bands; and
   a photovoltaic device having band gaps for selectively absorbing and converting to electric current radiation in said characteristic wavelength bands.

10. A system as recited in claim 9, wherein the emitting surface comprises primarily an oxide of a metal selected from the group consisting of aluminum and yttrium.

11. A system as recited in claim 10, wherein the surface further comprises a minor amount of a rare earth metal oxide.

12. A system as recited in claim 11, wherein the surface further comprises an oxide of a metal selected from the group consisting of magnesium and tin.

13. A system as recited in claim 11, wherein the surface comprises from 8 to 20% yttrium.

14. A system as recited in claim 9, wherein the emitting surface comprises a porous surface combustion burner.

15. A system as recited in claim 14, wherein the porous surface combustion burner comprises ceramic fibers including at least one rare earth metal oxide adjacent to its outer surface.

16. A system as recited in claim 9, wherein the photovoltaic device comprises a plurality of layers of photovoltaic material wherein at least the upper layer selectively absorbs radiation of one characteristic wavelength band and is transparent to radiation of the other characteristic wavelength and the underlying layer absorbs the other characteristic wavelength band.

17. A system as recited in claim 9 wherein the emitting surface comprises a nonporous ceramic tube having a thermally stimulated quantum emitting material on at least its outer surface and means for supporting combustion inside the tube.

18. A system as recited in claim 17 wherein the ceramic tube comprises a layer of at least one rare earth metal oxide on the outer surface.

19. A method for generating electricity comprising:
   heating a ceramic surface to a sufficient temperature to emit quantum radiation in at least two characteristic wavelength bands, the ceramic surface comprising primarily an oxide of at least one metal selected from the group consisting of aluminum, gallium, yttrium, zirconium and thorium, and a minor amount of an oxide of a metal with unfilled inner electron shells; and
   selectively absorbing the characteristic wavelength bands in successive layers of a photovoltaic device for converting the radiation to electric current.

20. A method as recited in claim 19 comprising:
   forming the ceramic surface to contain sufficient metal with unfilled inner electron shells to emit more than 50% of the radiation as thermally stimulated quantum radiation;

21. A method as recited in claim 19 comprising forming the ceramic surface to include a rare earth metal oxide.

* * * * *